United States Patent [19]

MacDonald

[11] 4,327,328
[45] Apr. 27, 1982

[54] PROGRAMMABLE TIMING CIRCUIT

[75] Inventor: Malcolm F. MacDonald, Chelmsford, Mass.

[73] Assignee: GTE Laboratories Incorporated, Waltham, Mass.

[21] Appl. No.: 129,132

[22] Filed: Mar. 10, 1980

[51] Int. Cl.³ ............................................. H03K 5/159
[52] U.S. Cl. .......................................... 328/55; 328/59
[58] Field of Search ....................... 328/59, 28, 36, 55; 307/362; 331/173, 172

[56] References Cited

U.S. PATENT DOCUMENTS 4,064,423 12/1977 Atkisson, Jr. ............................ 328/14
4,199,276 4/1980 Bukosky et al. ........................ 328/14

*Primary Examiner*—David K. Moore
*Attorney, Agent, or Firm*—Fred Fisher

[57] ABSTRACT

Time delayed signals are produced by apparatus including an oscillator which provides signals at a constant frequency to a multi-stage frequency divider. One of the stages of the divider is selected and is applied to a multiple-stage frequency divider which provides signals at outputs of various stages thereof. At least a portion of the outputs of the various stages are utilized for controlling the selection of the stage applied to the multiple-stage frequency divider. A digital to analog converter, responsive to the outputs of the multiple-stage frequency divider, provides an analog output signal to a comparator. The comparator provides an output signal when the analog output signal is at least equal to a predetermined voltage.

3 Claims, 2 Drawing Figures

PROGRAMMABLE TIMING CIRCUIT

BACKGROUND OF THE INVENTION

1. Field of the Invention

This invention relates to programmable timing circuits, and, in particular, to non-linear programmable timing circuits. Accordingly, it is a general object of this invention to provide new and improved circuits of such character.

A programmable timing circuit, in accordance with this invention, can generate a precise timing interval which can be conveniently adjusted by a potentiometer. It finds general applications in the fields of machine control and materials handling, particularly in combination with other devices to form a time delay relay.

2. Description of the Prior Art

Programmable time delays employing electronics generally fall into two categories, an RC analog technique employing a potentiometer or a digital technique which usually employs multiposition discrete switches.

The RC technique, generally, relies upon the time interval created by the charging of a capacitor through a resistor. Disadvantageously, a problem arises in generating long delays, in that, for long delays, the charging currents are very small, and capacitor leakages are so high that reliable and repeatable performances over time and temperature become a complex task.

The digital technique, generally, relies upon a high frequency clock source which is frequency divided, and time is selected by digital switching. However, the cost and size of a suitable digital switch mechanism makes such an apparatus impractical for many applications.

SUMMARY OF THE INVENTION

Another object of this invention is to provide for a new and improved delay timer circuit which has the advantages and best features of both analog and digital techniques in one device.

Still another object of this invention is to provide for a new and improved delay timer circuit which provides for very long selectable time delays, realizable with low cost, self-compensating components.

Yet another object of this invention is to provide for a new and improved circuit in which time selection is achieved by varying a simple, linear potentiometer.

Still yet another object of this invention is to provide for a new and improved circuit in which nonlinear digital feedback is utilized to achieve an extended time range selection without mode selection.

In accordance with one embodiment of this invention, apparatus for producing timed delayed signals includes an oscillator which provides signals at a constant frequency to multistage frequency divider. One of the outputs from one of the stages of the frequency divider is selected to be coupled to a multiple-stage frequency divider which provides signals at outputs of various stages thereof to a digital to analog converter. At least a portion of the outputs of the multiple-stage frequency divider are used for controlling the selection of the output to be coupled to the multiple-stage frequency divider. The analog output of the converter, and a varied voltage source, are coupled to a comparator which provides an output therefrom when the analog output is at least equal to the varied voltage.

In accordance with another embodiment of the invention, timed delayed signals can be produced by apparatus which includes an oscillator that provides signals at a constant frequency via a coupled switching means to a multistage binary frequency divider. A selected output from one of the stages of the frequency divider is coupled to a multiple-stage binary frequency divider which provides a binary coded digital signal in parallel on output lines therefrom corresponding in number to the number of stages of the multiple-stage binary frequency divider. A digital to analog converter converts the binary coded digital signal to an analog signal and applies the output to a comparator. A variable voltage obtained from a contact member of a potentiometer coupled across a voltage source is applied to the comparator. The comparator provides an output signal when the analog signal is at least equal to the variable voltage. At least a portion of the binary coded digital signal is utilized for controlling the selection of the output stages of the multi-stage binary frequency divider.

Yet in accordance with another embodiment of the invention, timed delayed signals are produced by apparatus including a high frequency source which is coupled to a frequency divider that provides a digital output therefrom. The frequency divider is coupled to cause a non-linear action to occur therewithin. A digital to analog converter receives the digital signal and provides an analog output therefrom. A comparator receives the analog output and a varied voltage source, providing an output signal when the analog output is at least equal to the varied voltage.

BRIEF DESCRIPTION OF THE DRAWING

Other objects, advantages, and features of this invention, together with its construction and mode of operation, will become more apparent from the following description, when read in conjunction with the accompanying drawing, in which.

DESCRIPTION OF PREFERRED EMBODIMENTS

The incorporation of a high frequency clock with digital time division provides for the use of practical and realizable low cost resistors and capacitors which can provide very long time delays with precise repeatability, as will become more apparent herinafter. A conventional digital to analog converter permits the timer to be programmed with a linear potentiometer and still provide the necessary repeat accuracy. In most applications, the resolution of the timer need not be better than its repeat accuracy, normally expressed as a percentage of set time. A non-linearizing feedback enables the selection of time to be non-linear, thus providing for an expanded range of time selection without converting to another clock frequency. Through the use of circuits which are "bridge balance", the circuit precision becomes highly independent of changes in applied voltage, eliminating the need for precise voltage regulation.

CIRCUIT DESCRIPTION

Figure 1:
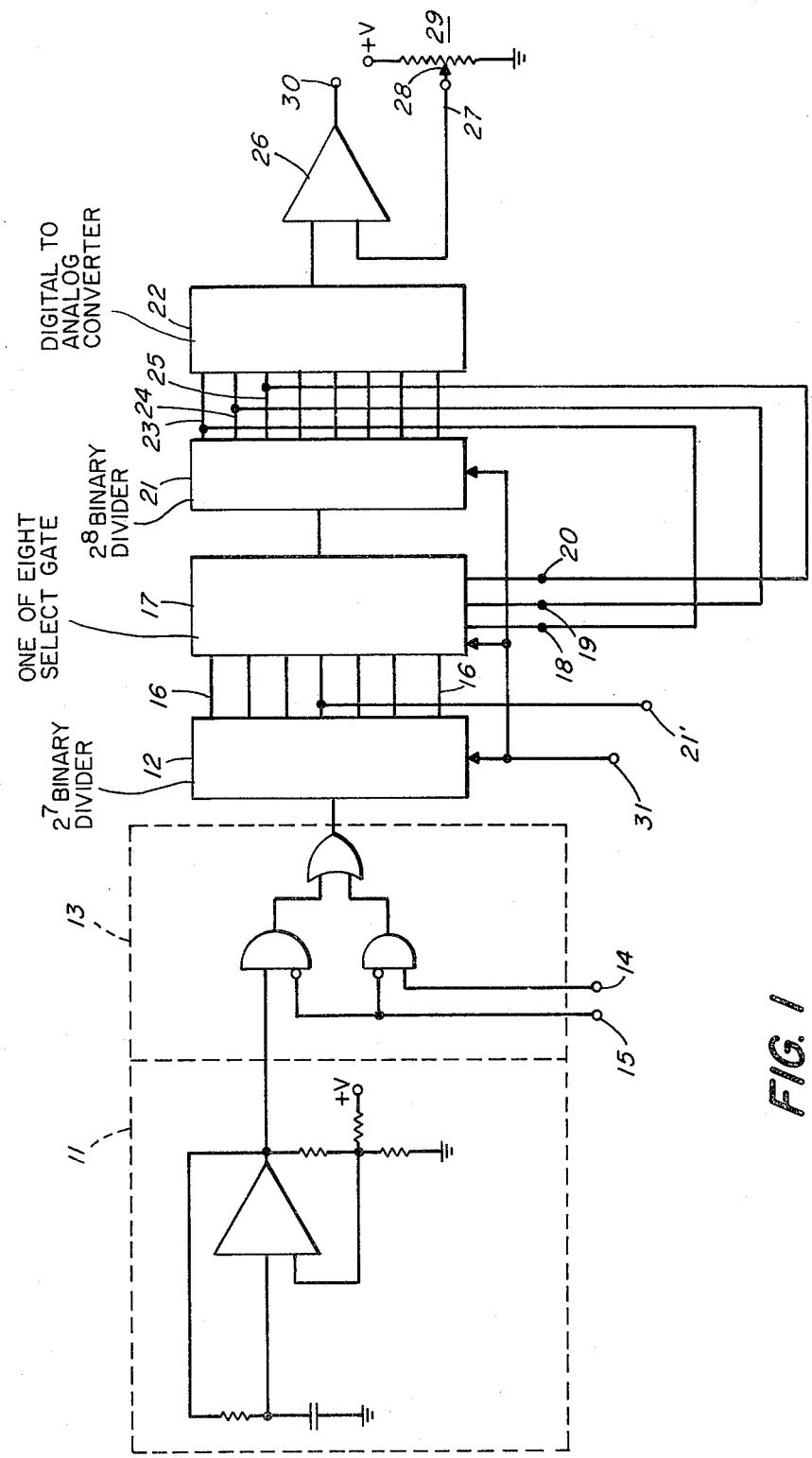
FIG. 1 is a block diagram of one embodiment of the invention.

Referring to FIG. 1, an RC programmable clock (multivibrator) 11 creates a constant time interval which is introduced into a multi-stage frequency divider 12, such as a $2^7$ binary divider, through a digital switch 13. The digital switch 13 provides for an injection of an external clock through an appropriate terminal 14 or provides inhibiting of timing advance by disabling the internal clock via a terminal 15. The clock signal is divided in the $2^7$ binary divider 12 and provides seven parallel clock lines 16—16, each twice as slow as the previous. These seven lines 16—16 can be selected by a one of eight select gate 17 controlled by three terminals 18, 19, 20 in a standard binary format. A line 21', coupled to one (e.g., the center one) of the lines 16—16, provides a representation of the clock frequency for indication of operation and calibration. The output of the one of eight select gate 17 is further divided by a multiple-stage frequency divider 21, such as $2^8$ binary divider, whose output controls a digital to analog converter 22, preferably an R-2R resistor network. The three highest ordered bits of this binary division is provided on lines 23, 24, and 25. The output voltage of the converter 22 is inputted to one side of a comparator 26 and a comparison is made against a present voltage on a terminal 27, coupled to a centertap 28 of a potentiometer 29 which couples a voltage source $+V$ to a point of reference potential such as ground. The reference potential $+V$ is also the source for generating the output from the converter 22 such that the comparator measures the balance condition between the potentiometer and the converter and is independent of the value of $+V$. The compared digital output is then connected to an output terminal 30. A reset line is provided on a terminal 31 which guarantees a precise start of the multivibrator clock 11 and also guarantees the condition of the binary divider chains 12 and 21.

APPLICATIONS

A present mode of application of the invention is as a non-linear timer to implement on-delay and off-delay functions in a time delay relay. In this application, terminals 18, 29 and 19 are connected to lines 23, 24, and 25 to provide successive binary reduction of frequency into the $2^8$ divider 21. Grounding of terminals 14 and 15 permanently connect the internal clock 11.

Figure 2:
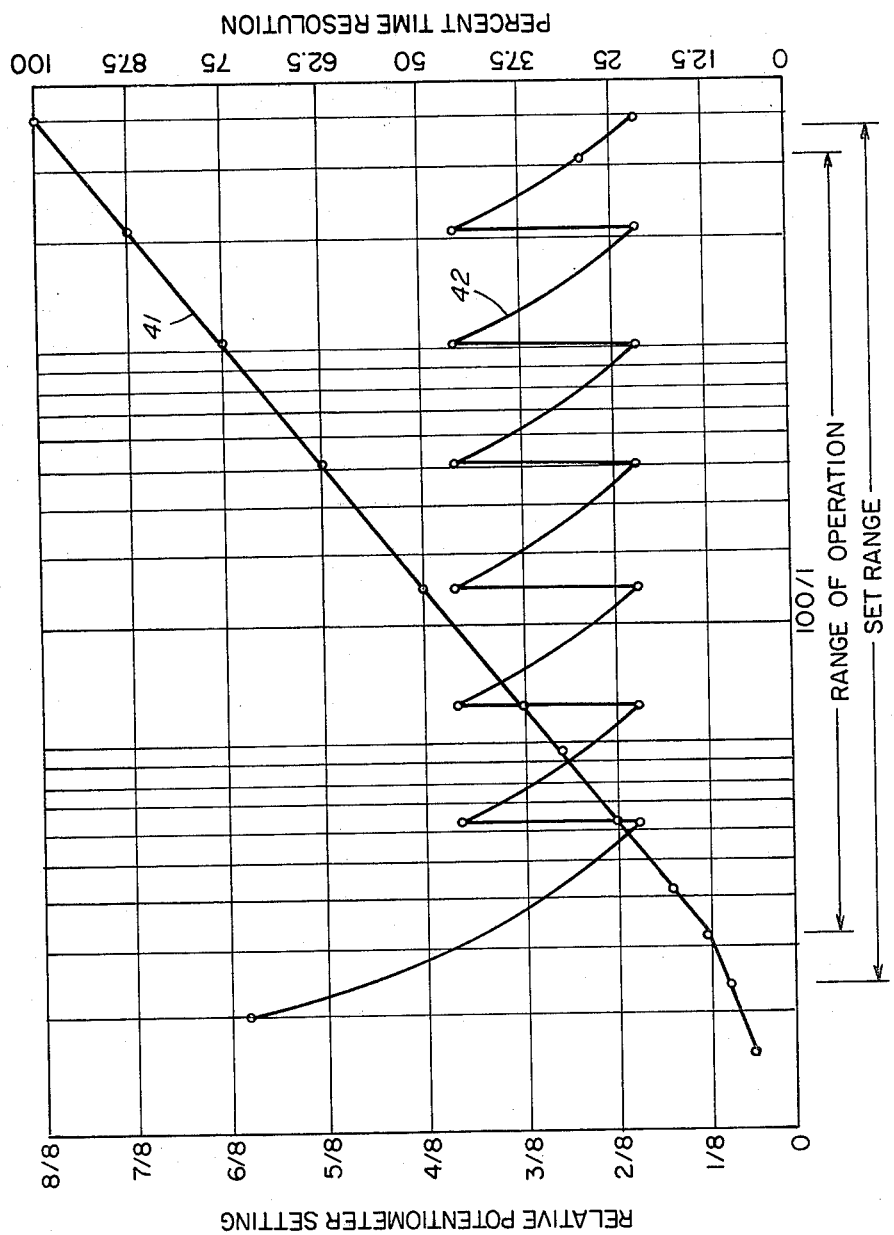
FIG. 2 is a set of curves useful for understanding the invention.

The foregoing connection provides for applications employed in the time delay relay. With such connection, an output time can be programmed which follows the transfer characteristics shown in FIG. 2. Note that the time is approximately a straight line 41 on a semi-log plot over a useful range of 100/1 in time.

The extended range can be achieved by recognizing that time resolution can be a percentage of the set time. The saw-tooth shaped curve 42 is the time resolution of the timer. By making time select terminals available, it is possible to make the device a linear timer with remote programmability, such that one of seven time delays can be selected, all binary related.

A one-shot function can be achieved by feeding back the comparator output 30 to the clock select control 15 causing a latch to exist. The terminal 14 can be wired low and reset can be achieved through the terminal 31. Other modifications can be performed by those skilled in the art, without departing from the spirit and scope of the invention.

Apparatus in accordance with the invention can be used for digitizing the magnitude of a variable voltage for conversion to a precise and repeatable time period, essentially a form of voltage to frequency conversion. In this application, the period of conversion can be digitally selected and the feedback used to create a logarithmic voltage to frequency converter to accommodate an expanded input range of voltage where resolution can be proportioned to input voltage.

What is claimed is:
1. Apparatus for providing a timed delayed signal comprising:
   an oscillator for providing signals at a constant frequency;
   a multi-stage binary frequency divider;
   switching means for coupling said signals from said oscillator to an input of said frequency divider;
   means for selecting an output from one of said stages of said frequency divider;
   a multiple-stage binary frequency divider responsive to the selected output for providing a binary coded digital signal in parallel on output lines therefrom corresponding in number to the number of stages of said multiple-stage binary frequency divider;
   a digital to analog converter responsive to said binary coded digital signal for providing an analog output therefrom;
   a potentiometer adapted to be coupled across a voltage source for producing a variable voltage from a contact member therefrom;
   a comparator adapted to provide an output signal therefrom when said analog output is at least equal to said variable voltage; and
   means responsive to at least a portion of said binary coded digital signal for controlling said selecting means.

2. Apparatus for producing timed delayed signals comprising:
   an oscillator for providing signals at a constant frequency;
   a multi-stage frequency divider coupled to receive said signals from said oscillator;
   means for selecting an output from one of said stages of said frequency divider;
   a multi-stage frequency divider responsive to the selected output for providing signals at outputs of various stages thereof;
   means responsive to at least a portion of said outputs of said various stages for controlling said selecting means;
   a digital to analog converter responsive to said outputs of said multiple-stage frequency divider for providing an analog output therefrom;
   means for providing a varied voltage source; and
   a comparator having one input coupled to receive said analog output and a second input coupled to receive said varied voltage source for providing an output signal therefrom when said analog output is at least equal to said varied voltage.

3. Apparatus for producing timed delayed signals comprising:
   a high frequency source;
   a frequency divider coupled to said source for providing a digital output therefrom;
   means coupled to said frequency divider for causing a non-linear action to occur therewithin;
   a digital to analog converter coupled to receive said digital output, and to provide an analog output therefrom;
   means for providing a varied voltage source; and
   a comparator having one input coupled to receive said analog output and a second input coupled to receive said varied voltage source for providing an output signal therefrom when said analog output is at least equal to said varied voltage.

* * * * *